(12) United States Patent
Hand et al.

(10) Patent No.: US 11,716,064 B1
(45) Date of Patent: Aug. 1, 2023

(54) WIDEBAND DISTRIBUTED GAIN EQUALIZATION CIRCUIT

(71) Applicant: LOCKHEED MARTIN CORPORATION, Bethesda, MD (US)

(72) Inventors: Thomas Henry Hand, Highlands Ranch, CO (US); Joshua David Gustafson, Castle Rock, CO (US); Aaron Christopher Rothlisberger, Littleton, CO (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 278 days.

(21) Appl. No.: 17/142,098

(22) Filed: Jan. 5, 2021

(51) Int. Cl.
*H03G 5/16* (2006.01)
*H01P 3/08* (2006.01)
*H04B 1/12* (2006.01)
*H05K 1/02* (2006.01)

(52) U.S. Cl.
CPC ............ *H03G 5/165* (2013.01); *H01P 3/08* (2013.01); *H04B 1/12* (2013.01); *H05K 1/025* (2013.01)

(58) Field of Classification Search
CPC . H03G 5/165; H01P 3/08; H04B 1/12; H05K 1/025
See application file for complete search history.

(56) References Cited

U.S. PATENT DOCUMENTS

| 5,557,247 | A * | 9/1996 | Vaughn, Jr. | G01R 33/34046 324/318 |
| 2007/0066885 | A1* | 3/2007 | Vaughan | G01R 33/283 324/318 |
| 2008/0024133 | A1* | 1/2008 | Vaughan | G01R 33/3678 324/318 |
| 2010/0164651 | A1* | 7/2010 | Erb | H01P 1/20345 333/204 |
| 2013/0093046 | A1* | 4/2013 | Bayerer | H01L 23/645 257/532 |
| 2014/0139400 | A1* | 5/2014 | Voss | H01Q 1/02 343/904 |
| 2016/0156109 | A1* | 6/2016 | Anderson | H01Q 21/062 29/601 |
| 2020/0176843 | A1* | 6/2020 | Kwok | H03H 7/1758 |

* cited by examiner

*Primary Examiner* — Jungpeng Chen
(74) *Attorney, Agent, or Firm* — BakerHostetler (57) ABSTRACT

Distributed gain equalization circuits for use with radio frequency (RF) devices are provided. The distributed gain equalization circuits include a substrate layer, multiple transverse electromagnetic (TEM) line circuits disposed on the substrate layer and multiple traces disposed on the substrate layer, each trace connected to one or more of the TEM line circuits. The traces and TEM line circuits are configured to provide resistances, inductances and capacitances to eliminate the need for lumped or packaged resistors, inductors and capacitors. The distributed gain equalization circuit operates at millimeter wave frequencies and provides a compensating gain slope to counteract a negative gain slope of the RF device. Methods of manufacturing distributed gain equalization circuits are also provided.

20 Claims, 6 Drawing Sheets

WIDEBAND DISTRIBUTED GAIN EQUALIZATION CIRCUIT

STATEMENT REGARDING FEDERALLY SPONSORED RESEARCH OR DEVELOPMENT

Not applicable.

FIELD OF THE INVENTION

The present invention generally relates to wideband distributed gain equalization circuits, and more particularly to millimeter wave (mmW) frequency based distributed gain equalization circuits.

BACKGROUND

High losses and dispersion at millimeter wave frequencies make gain equalization difficult. Over wide bandwidths of operation, a significant loss slope can be present from the lowest to the highest frequency. Because the losses in the circuitry are typically more severe at the higher frequencies, a negative gain slope is usually present across the band. This uneven gain response can be problematic for receivers, so a gain circuit (e.g., gain equalizer circuit) is typically implemented to provide a positive gain slope equal and opposite in magnitude to compensate for the natural negative gain slope of the system. For example, typical RE gain equalizers, both narrowband and wideband, consist of a combination of distributed transmission lines and lumped components, such as resistors, inductors and capacitors, to realize the required spectral response.

However, such lumped/surface mount components introduce issues at mmW frequencies, such as radio frequency (RF) parasitic effects of the lumped components that can detune the device. Additionally, the RF parasitic effects of the packaged lumped components can excite in-band resonances, which are especially risky and problematic over the wide operating band of the device.

SUMMARY

According to various aspects of the subject technology, methods and configurations are disclosed for providing purely distributed wideband circuits having transmission line traces and stripline circuits without requiring lumped resistors, inductors, or capacitors.

In one or more aspects, a wideband distributed gain equalization circuit includes a substrate layer, a plurality of transverse electromagnetic (TEM) line circuits disposed on the substrate layer, and a plurality of traces disposed on the substrate layer, each trace connected to one or more of the plurality of TEM line circuits. The plurality of TEM line circuits are configured to provide at least one of a resistance, an inductance and a capacitance.

In one or more aspects, an RF system includes an RF device and a distributed equalizer circuit connected to the RF device. The distributed equalizer circuit includes a plurality of TEM line circuits disposed on a substrate layer and a plurality of traces disposed on the substrate layer, each trace connected to one or more of the plurality of TEM line circuits. The plurality of TEM line circuits are configured to provide at least one resistance in place of a packaged resistor, at least one inductance in place of a packaged inductor, and at least one capacitance in place of a packaged capacitor. The distributed equalizer circuit is configured to provide a compensating gain slope to counteract a negative gain slope of the RF device.

In one or more aspects, a method of manufacturing a wideband distributed gain equalization circuit includes determining one or more resistances, one or more inductances and one or more capacitances of a gain equalization circuit to be connected to a radio frequency (RF) device. The method also includes etching trace lines and TEM lines on a substrate of the gain equalization circuit to form the resistor, inductor and capacitor values required to achieve the required gain slope response. The method further includes controlling TEM line section dimensions and adding gaps to realize the determined one or more resistances, one or more inductances and one or more capacitances.

The foregoing has outlined rather broadly the features of the present disclosure so that the following detailed description can be better understood. Additional features and advantages of the disclosure, which form the subject of the claims, will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block-diagram form in order to avoid obscuring the concepts of the subject technology.

Methods and configurations are disclosed for providing purely distributed circuits having transmission line traces and TEM circuits, such as stripline, microstrip, co-planar waveguide (CPW), etc. circuits, in place of lumped elements such as resistors, inductors and capacitors. The TEM line circuits are configured to provide the required resistance in place of a packaged or surface mount resistor, the necessary inductance in place of a packaged or surface mount inductor, and the required capacitance in place of a packaged or surface mount capacitor. The subject technology provides for high RF performance that overcomes the impracticality of using lumped components in RF circuits due to RF losses that become too high and the difficulty in finding lumped components that reliably operate at mmW frequencies. Also, the performance of the distributed device of the subject technology is only limited by the etch tolerance of a printed circuit board (PCB) instead of poor tolerances of lumped circuit surface mount parts, the etch tolerance being significantly smaller than the smallest trace feature provided by current fabrication technologies. Accordingly, the subject technology provides a high correlation between modeled versus measured RF performance, thus maximizing the likelihood of first-pass design success.

In addition, the subject technology eliminates in-band resonance risks due to the absence of packaged parts, which can suffer from significant in-band resonances that degrade the performance of a lumped component device to the point of non-compliance to system requirements. The absence of in-band resonance provides for the distributed circuits of the subject technology to be used over large fractional bandwidths, which is desirable for many wideband frequency devices.

The subject technology also provides for a lower manufacturing cost than for typical lumped component devices because the distributed circuit eliminates the need to solder/attach packaged components (e.g., resistors, inductors, capacitors) to the PCB, which removes an assembly step during the board development. In addition, the subject technology provides increased reliability since the distributed devices do not require soldered components and are able to perform over a wider temperature range than devices with lumped components. Thus, the subject technology provides for longer mission durations since solder fatigue is a non-issue.

Figure 1:
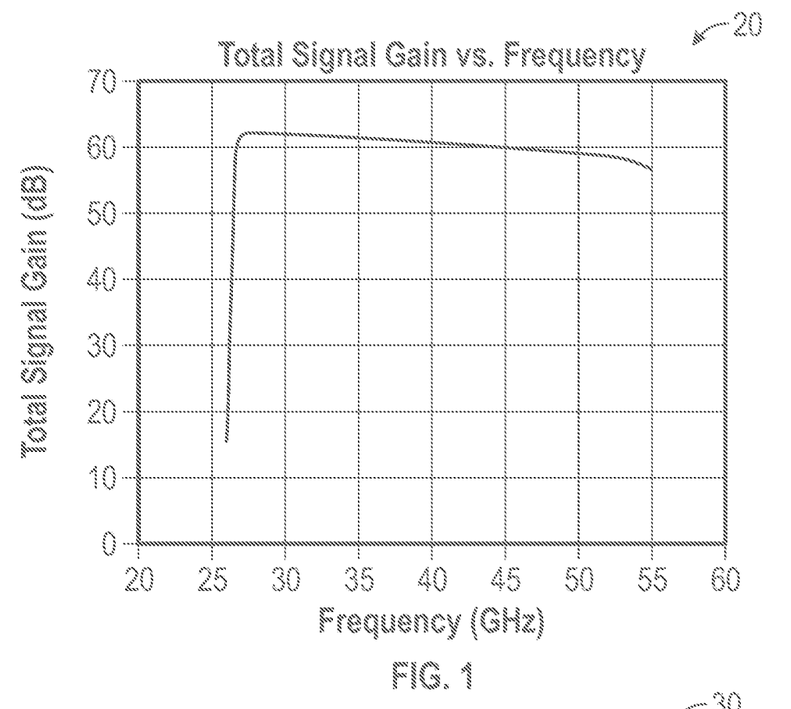
FIG. 1 is a schematic illustration of a loss slope of an example 26.5-53 GHz transmission line.
Figure 2:
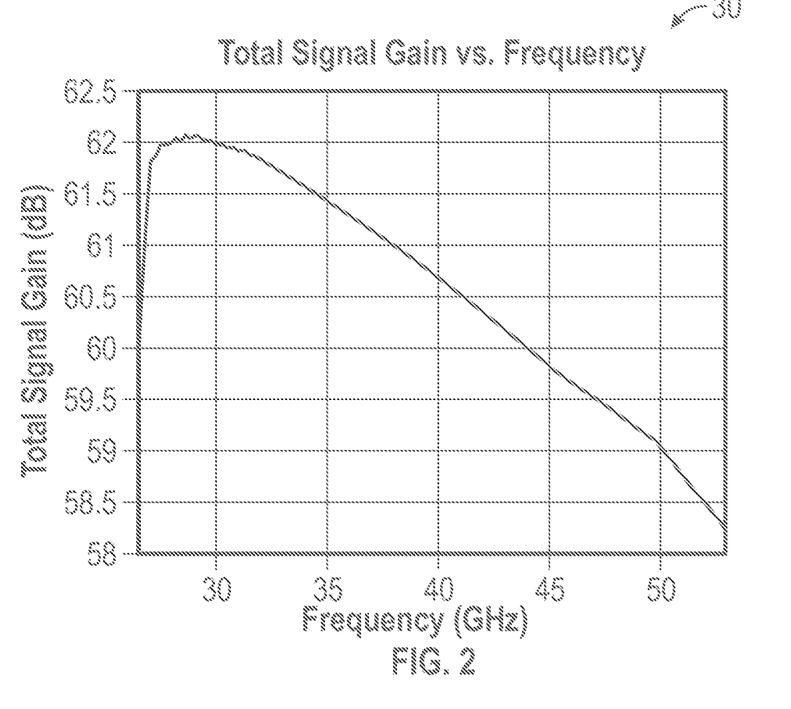
FIG. 2 is schematic partial view of the loss slope of FIG. 1.

FIGS. 1 and 2 illustrate a total signal gain versus frequency for an example 26.5-53 GHz circuit. Graph 20 shows the signal gain from about 15 dB to 62 dB over the 26.5-53 GHz range. Graph 30 shows a close-up view of the signal gain from about 58 dB to 62 dB over the 26.5-53 GHz range. Thus, the example 26.5-53 GHz circuit demonstrates about a 4 dB loss slope across the 26.5 GHz bandwidth (e.g., slope m=−0.15 dB/GHz) due to lossy components and transmission lines response vs. frequency. This loss slope can be problematic for receivers that have to process large portions of this bandwidth (e.g., 2 GHz, 4 GHz, etc.). Also, severe gain slopes can limit the instantaneous bandwidth of any system, here the example 26.5-53 GHz circuit. Further, gain slopes induce a taper on the sub-band being digitized, which leads to increased loss.

Figure 3:
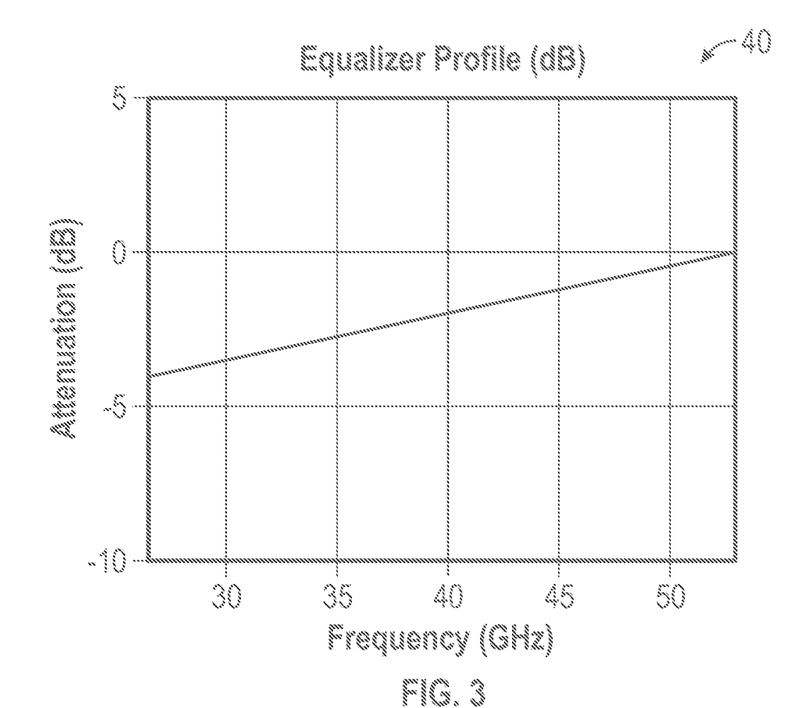
FIG. 3 is a schematic view of an ideal gain equalization slope to compensate for the loss slope of FIG. 1.

FIG. 3 is a graph 40 that shows an ideal gain equalization slope profile to compensate for the loss slope of the example 26.5-53 GHz circuit. Here, the equalization needs to be about 4 dB attenuation at 26.5 GHz with 0 dB attenuation at 53 GHz, so the slope should be m=+4/26.5 dB/GHz. The equation to generate this slope is y(f)=mF+b with b=−8 dB. Thus, the equation for an ideal equalizer to compensate for the negative slope of the 26.5-53 GHz example circuit is $Y_{equalizer}(F)=(4/26.4)*F-8$.

Figure 4:
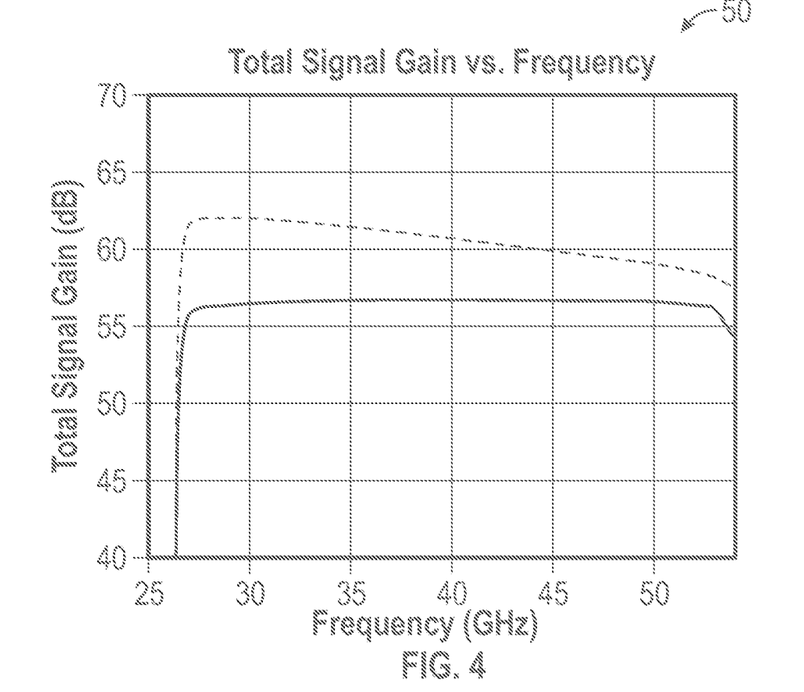
FIG. 4 is a schematic diagram of a total signal gain versus frequency of the example circuit of FIG. 1 before and after equalization is applied.

As shown in FIG. 4, graph 50 shows how a gain equalization circuit (e.g., equalizer circuit) fixes the negative 4 dB gain slope across the band of the example 26.5-53 GHz circuit. Here, the equalizer profile compensates for gain variation. For example, with the equalization profile of graph 40, the gain varies less than plus or minus 0.5 dB across 26.5-53 GHz, assuming a 2 dB insertion loss for the equalizer circuit. Thus, the negative slope shown in graph 50 is the negative 4 dB loss slope shown in graph 20, and the flat curve shown in graph 50 is the final gain slope after the gain equalization circuit is applied. As clearly shown, the flat gain response is achieved across the bandwidth of the example 26.5-53 GHz circuit.

Figure 5:
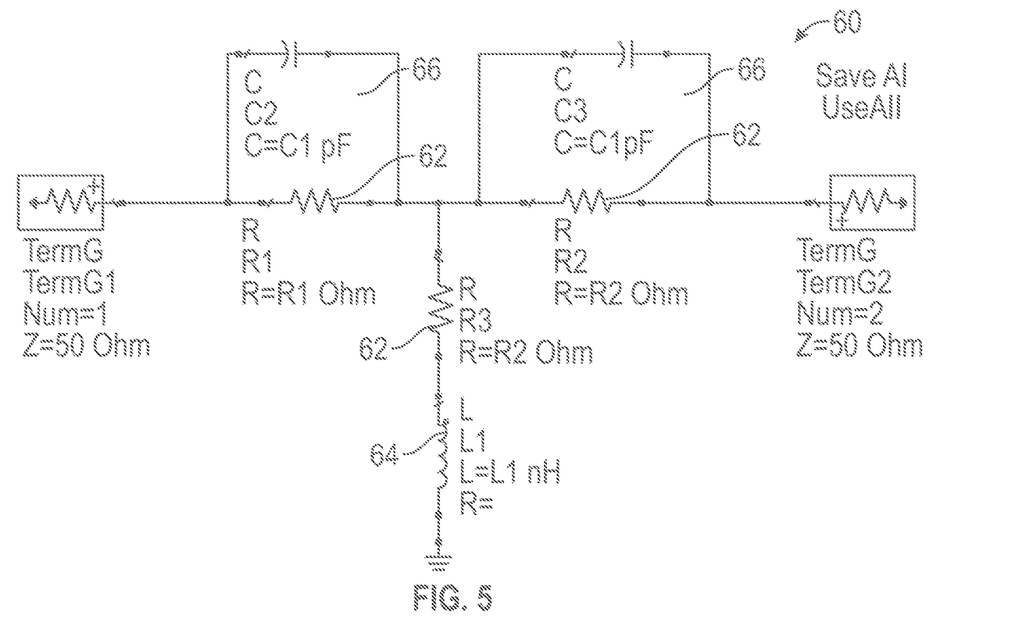
FIG. 5 is a schematic diagram of a typical gain equalization circuit using lumped resistor, capacitor, and inductor components.

As shown in FIG. 5, a typical gain equalization (e.g., equalizer) circuit 60 uses lumped or surface mount packaged components, such as resistors 62, inductors 64 and capacitors 66. Here, the gain equalization circuit 60 realizes the gain slope profile needed to compensate for the negative gain slope of the example 26.5-53 GHz circuit. In other words, the gain equalization circuit, when cascaded with the original uncompensated system, 60 provides the flat gain profile shown in graph 50 when used in conjunction with the 26.5-53 GHz circuit.

However, as discussed above, the lumped element components can be problematic at high frequencies as the parasitic effects of the component packaging can degrade performance of the 26.5-53 GHz circuit and lumped component tolerancing can result in low-yield and/or degraded performance of the 26.5-53 GHz circuit.

Figure 6:
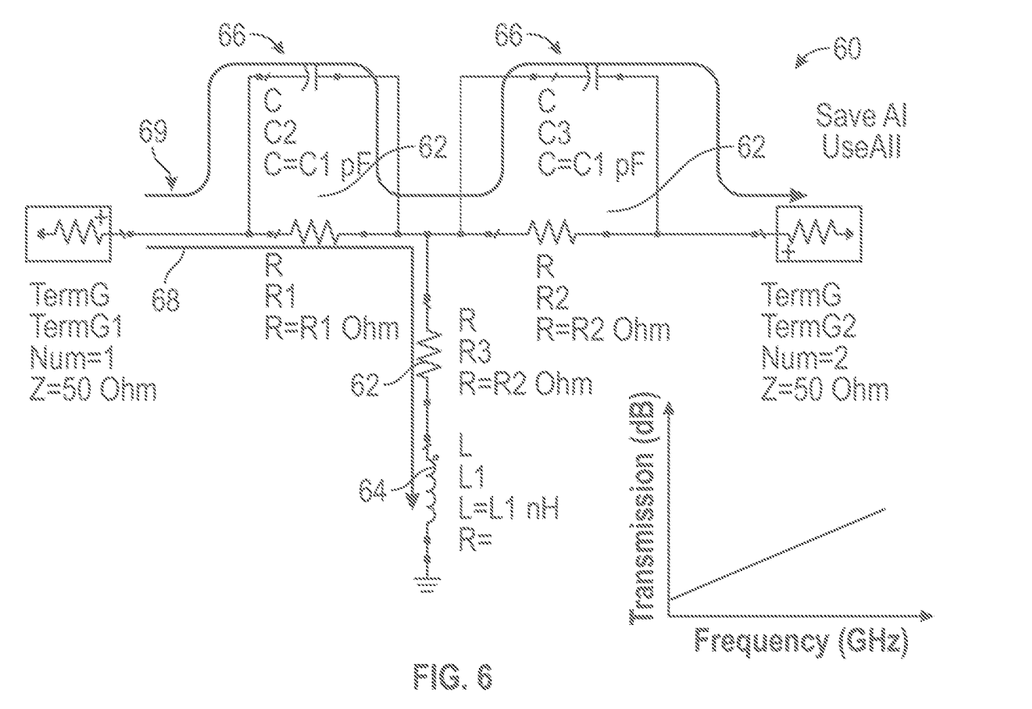
FIG. 6 is an annotated view of the diagram of FIG. 5, showing the different circuit paths followed by low frequencies and high frequencies.

As shown in FIG. 6, at low frequencies in gain equalization circuit 60, the capacitors 66 tend to block the signal and the shortest path to ground is through a series resistor 62 and a shunt resistor 62/inductor 64 as shown by signal path 68. At high frequencies in gain equalization circuit 60, the signal is diverted through the shunt capacitors 66 (e.g., parallel capacitors 66), thus bypassing the lossy series resistors 62. Thus, at high frequencies the lower impedance of the parallel capacitors 66 diverts the energy around the lossy resistors 62 via the parallel capacitor 66 branch.

Figure 7:
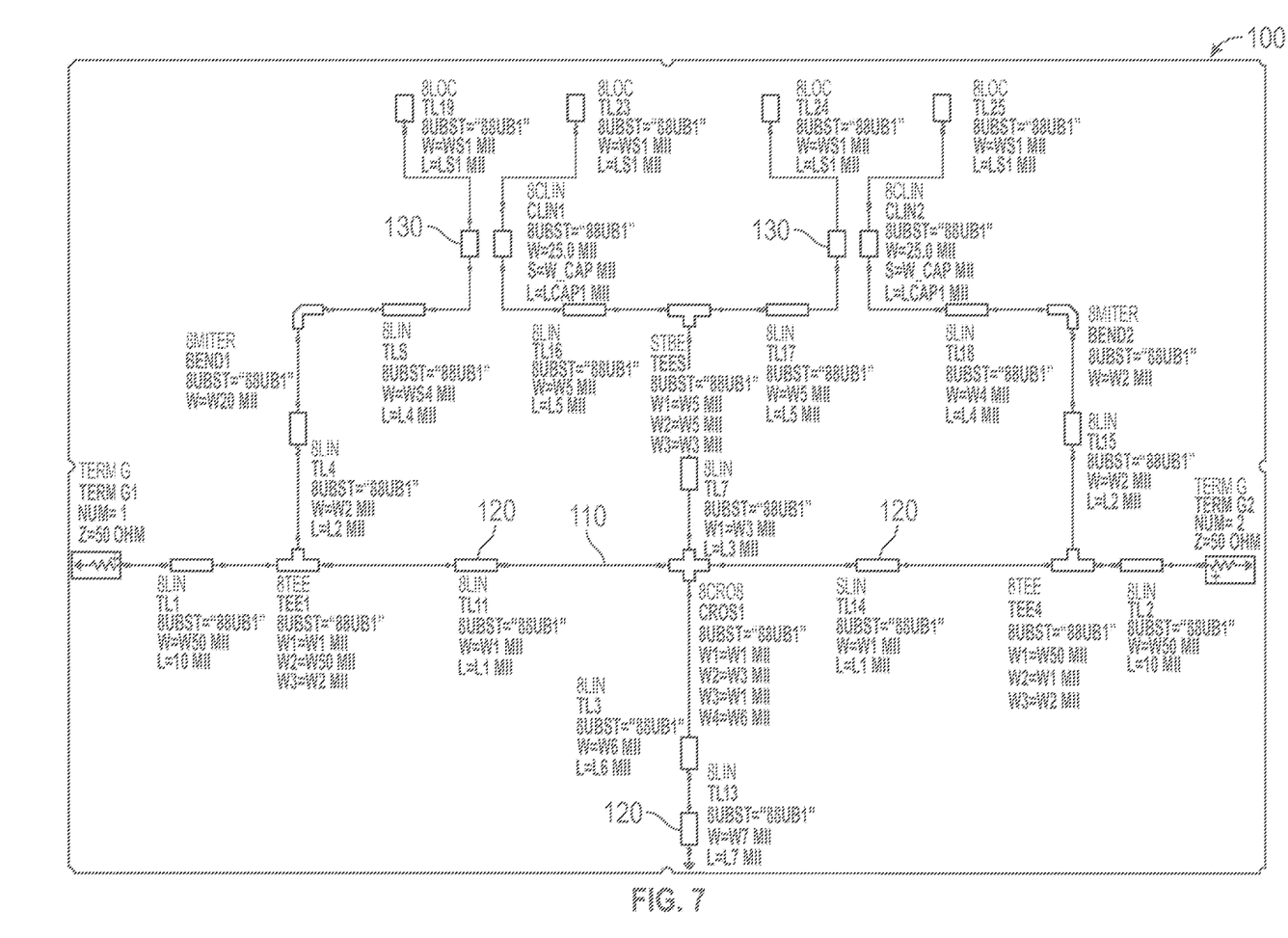
FIG. 7 is a schematic diagram of an example wideband distributed gain equalization circuit using no lumped components, according to certain aspects of the disclosure.

FIG. 7 shows an example distributed gain equalization (e.g., equalizer) circuit 100, according to certain aspects of the disclosure. The gain equalization circuit 100 is a purely distributed circuit lacking any lumped or surface mount components, such as the resistors 62, inductors 64 and capacitors used in gain equalization circuit 60. Instead, the resistance, inductance and capacitance requirements may be realized through tailored lossy transmission lines 110 and passive TEM circuits 120, as opposed to discrete surface mount resistors. The main reason this is realizable is due to the higher transmission line (both conductor and dielectric) losses at mmW frequencies and the higher loss slope that naturally occurs in such lossy transmission lines 110. Also, the smaller capacitor and inductor values required at mmW frequencies provides for use of distributed TEM circuits 120 (e.g., microstrip, stripline, co-planar waveguide, etc.).

For example, the resistances of resistors 62 are realized with narrow TEM signal traces 120, the function of the inductor 64 of the gain equalization circuit 60 is realized with a simply a necked down signal trace, and the function of the parallel capacitor 66 is realized via an edge coupled TEM circuit 130. Thus, distributed gain equalization circuit 100 replaces all resistors 62, inductors 64 and capacitors 66 with fully distributed instantiations, where the resistance, inductance and capacitance functions may be based on length values of the transmission lines and/or TEM circuits 120. The fully distributed gain equalization circuit 100 may be provided as a buried TEM layer in a PCB.

Figure 8:
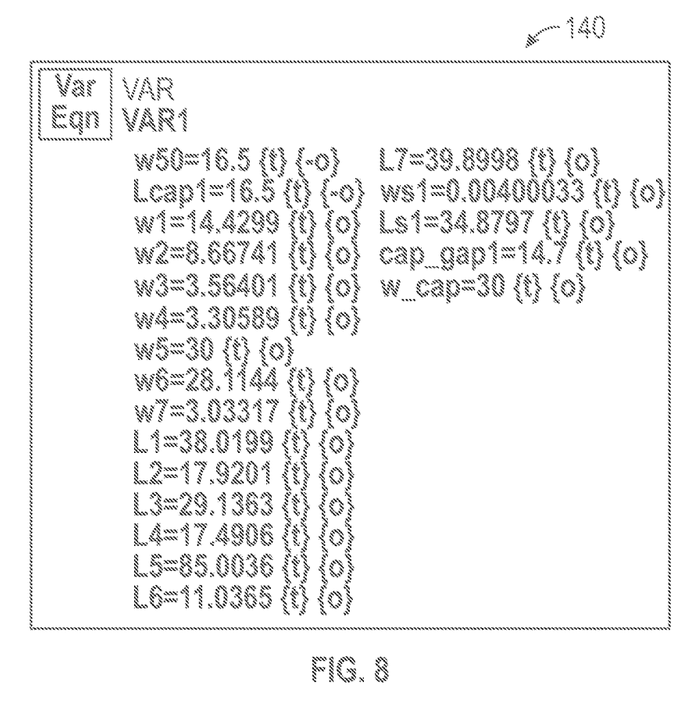
FIG. 8 is a schematic diagram of a component value table for the distributed gain equalization circuit of FIG. 7, according to certain aspects of the disclosure.
Figure 9:
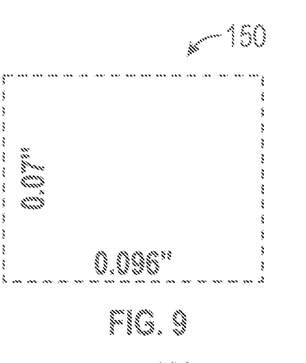
FIG. 9 is a schematic diagram of a PCB footprint estimate of the distributed gain equalization circuit of FIG. 7, according to certain aspects of the disclosure.

As shown in FIG. 8, table 140 shows a list of values associated with the gain equalization circuit 100. FIG. 9 shows the small PCB footprint 150 of the gain equalization circuit 100, which provides savings in PCB real estate over lumped component circuits such as gain equalization circuit 60. Further, since the entirety of the gain equalization circuit 100 is based on signal traces (e.g., lossy transmission lines 110) and TEM circuits 120, 130, there is no need for soldering or attaching components to the PCB in the area defined by the PCB footprint 150. In addition, the ability to realize smaller trace widths using advanced manufacturing techniques (e.g., 3D printing, 3D glass) provides for use of fully distributed gain circuits at lower frequencies than mmW frequencies.

Figure 10:
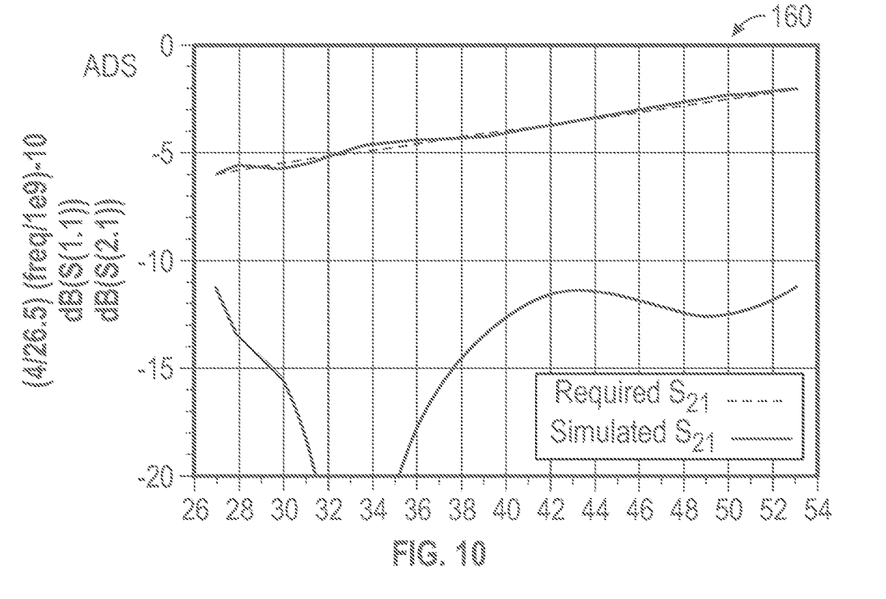
FIG. 10 is a schematic view of a gain equalization profile slope resulting from the distributed gain equalization circuit of FIG. 7, according to certain aspects of the disclosure.

Applying distributed gain equalization circuit 100 to the example 26.5-53 GHz circuit in place of using lumped component gain equalization circuit 60 provides the necessary gain equalization slope as shown in graph 160 of FIG. 10. Thus, the distributed gain equalization circuit 100 provides the desired flat total signal gain versus frequency curve without any of the problems associated with the lumped component gain equalization circuit 60, while providing all of the benefits of fully distributed circuitry, as discussed above.

While the example distributed gain equalization circuit 100 is a distributed wideband gain equalizer circuit, the fully distributed circuitry of the subject technology may be used in any application that utilizes transmission lines. For example, the fully distributed circuitry of the subject technology may be applied to any transmit or receive device or system. Further, the fully distributed circuitry of the subject technology may be used in other structures/devices besides PCBs, such as monolithic microwave integrated circuits (MMICs) and RF or optical waveguides, for example. Also, the subject technology makes wideband analog RF and ESA technologies more agnostic to the receiver because the equalization burden is no longer placed on the receiver, thus allowing analog RF systems to be compatible with a greater number of available receivers.

Figure 11:
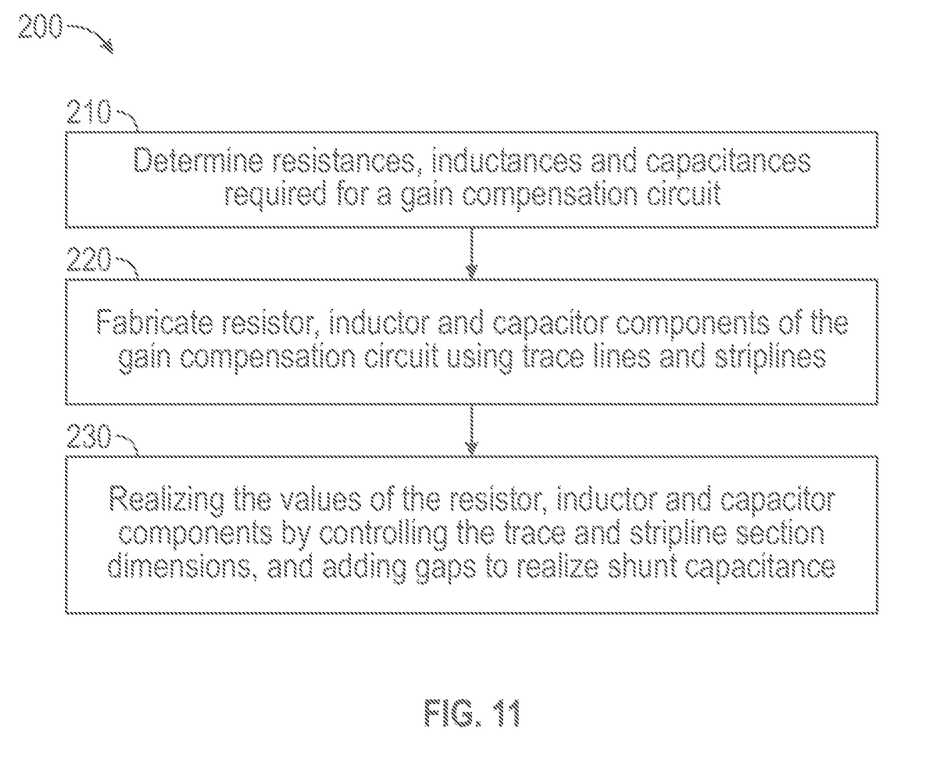
FIG. 11 illustrates a flow diagram of an example process for manufacturing a distributed gain equalization circuit, according to certain aspects of the disclosure.

A method 200 of making a distributed gain equalization circuit is shown in FIG. 11. The method begins in step 210 where necessary resistances, inductances and capacitances for a particular gain equalization circuit are determined or obtained. For example, resistance, inductance and capacitance values used in a typical lumped component gain equalization circuit may be used. Resistor, inductor and capacitor components of a gain equalization circuit are fabricated using traces and TEM lines, in step 220. For example, traces and stripline circuits and/or micros rips may by etched into a buried stripline layer in a PCB. In step 230, the values of the resistor, inductor and capacitor components are realized by controlling the trace and stripline section dimensions, and adding gaps to realize shunt capacitance. The resulting gain equalization circuit provides a fully distributed gain equalization circuit without the need for any packaged resistor, inductor and capacitor components.

In some aspects, the subject technology is related to communications technology, and. more particularly to RF systems, In some aspects, the subject technology may be used in various markets, including, for example and without limitation, sensor technology, communication systems and radar technology markets.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionalities. Whether such functionalities are implemented as hardware or software depends upon the particular application and design constraints imposed on the overall system. Skilled artisans may implement the described functionalities in varying ways for each particular application. Various components and blocks may be arranged differently (e.g., arranged in a different order, or partitioned in a different way), all without departing from the scope of the subject technology.

It is understood that any specific order or hierarchy of blocks in the processes disclosed is an illustration of example approaches, Based upon design preferences, it is understood that the specific order or hierarchy of blocks in the processes may be rearranged, or that all illustrated blocks may be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single hardware and software product or packaged into multiple hardware and software products.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one"unless specifically stated, but rather "one or more." The term "some" refers to one or more. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist" of the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meanings unless otherwise explicitly and clearly defined by the patentee. If there is any conflict in the usage of a word or term in this specification and one or more patent or other documents that may be incorporated herein by reference, the definition that is consistent with this specification should be adopted.

What is claimed is:

1. A wideband distributed gain equalization circuit comprising:
    a substrate layer;
    a plurality of transverse electromagnetic (TEM) line circuits disposed on the substrate layer; and
    a plurality of traces disposed on the substrate layer and coplanar with the plurality of TEM line circuits, each trace connected to one or more of the plurality of TEM line circuits,
    wherein at least one of the plurality of TEM line circuits is configured to provide a resistance, at least one of the plurality of TEM line circuits is configured to provide an inductance, and at least one of the plurality of TEM line circuits is configured to provide a capacitance.

2. The wideband distributed gain equalization circuit of claim 1, wherein one or more of the plurality of TEM line circuits are configured to provide an equivalent resistance of a lumped or packaged surface mount resistor.

3. The wideband distributed gain equalization circuit of claim 2, wherein the value of the resistance is configured by controlled TEM line section dimensions of the one or more of the plurality of TEM line circuits.

4. The wideband distributed gain equalization circuit of claim 1, wherein one or more of the plurality of TEM line circuits are configured to provide the inductance of a lumped or packaged surface mount inductor.

5. The wideband distributed gain equalization circuit of claim 4, wherein the value of the inductance is configured by controlled TEM line section dimensions of the one or more of the plurality of TEM line circuits.

6. The wideband distributed gain equalization circuit of claim 1, wherein the inductance is provided by a high inductance signal trace.

7. The wideband distributed gain equalization circuit of claim 1, wherein one or more of the plurality of TEM line circuits are configured to provide the capacitance of a lumped or packaged capacitor.

8. The wideband distributed gain equalization circuit of claim 7, wherein the value of the capacitance is configured by controlled TEM line section dimensions of the one or more of the plurality of TEM line circuits.

9. The wideband distributed gain equalization circuit of claim 7, wherein high capacitance distributed circuits are provided between the one or more of the plurality of TEM line circuits to provide shunt capacitance.

10. The wideband distributed gain equalization circuit of claim 1, wherein the plurality of TEM line circuits are etched into a layer on a printed circuit board.

11. The wideband distributed gain equalization circuit of claim 1, wherein the wideband distributed gain equalization circuit is configured to operate over a wide range of frequencies.

12. The wideband distributed gain equalization circuit of claim 1, wherein the wideband distributed gain equalization circuit is connected to a radio frequency (RF) device, the wideband distributed gain equalization circuit configured to provide a compensating gain slope to counteract a negative gain slope of the RF device.

13. The wideband distributed gain equalization circuit of claim 12, wherein the RF device is a phased array feed and the wideband distributed gain equalization circuit is an equalizer circuit.

14. The wideband distributed gain equalization circuit of claim 12, wherein the RF device is a monolithic microwave integrated circuit.

15. The wideband distributed gain equalization circuit of claim 12, wherein the RF device is a waveguide.

16. The wideband distributed gain equalization circuit of claim 1, wherein one or more of the plurality of TEM line circuits comprises microstrips, striplines, or coplanar waveguides.

17. A radio frequency (RF) system, comprising:
    an RF device; and
    a distributed equalizer circuit connected to the RF device, the distributed equalizer circuit comprising:
        a plurality of transverse electromagnetic (TEM) line circuits disposed on a substrate layer; and
        a plurality of traces disposed on the substrate layer and coplanar with the plurality of TEM line circuits, each trace connected to one or more of the plurality of TEM line circuits,
        wherein the plurality of TEM line circuits are configured to provide at least one resistance in place of a packaged resistor, at least one inductance in place of a packaged inductor, and at least one capacitance in place of a packaged capacitor,
        and wherein the distributed equalizer circuit is configured to provide a compensating gain slope to counteract a negative gain slope of the RF device.

18. The RF system of claim 17, wherein the RF device and the distributed equalizer circuit are configured to operate over a wideband millimeter wave frequency bandwidth.

19. The RF system of claim 17, wherein the value of each of the at least one resistance, at least one inductance and at least one capacitance is configured by controlled TEM line section dimensions of the plurality of TEM line circuits.

20. A method of manufacturing a wideband distributed gain equalization circuit, the method comprising:
    determining one or more resistances, one or more inductances and one or more capacitances of a gain equalization circuit to be connected to a radio frequency (RF) device;
    etching trace lines and transverse electromagnetic (TEM) lines on a substrate of the gain equalization circuit to form resistor, inductor and capacitor components, the trace lines and the TEM lines being coplanar on the substrate; and
    controlling TEM line section dimensions and adding gaps to realize the determined one or more resistances, one or more inductances and one or more capacitances.

* * * * *